United States Patent
Bolam et al.

(10) Patent No.: US 6,194,253 B1
(45) Date of Patent: Feb. 27, 2001

(54) METHOD FOR FABRICATION OF SILICON ON INSULATOR SUBSTRATES

(75) Inventors: Ronald Jay Bolam, East Fairfield; Richard James Evans; Anthony Michael Palagonia, both of Underhill, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/167,693

(22) Filed: Oct. 7, 1998

(51) Int. Cl.⁷ .................................................. H01L 21/00
(52) U.S. Cl. ........................................... 438/149; 438/149
(58) Field of Search ................................... 438/149, 404, 438/424, 705, 738, 753, 301, 296, 221

(56) References Cited

U.S. PATENT DOCUMENTS

| | | |
|---|---|---|
| 4,778,775 | 10/1988 | Tzeng . |
| 4,834,809 | 5/1989 | Kakihara . |
| 4,948,755 * | 8/1990 | Mo ........................................ 437/195 |
| 5,057,450 | 10/1991 | Bronner et al. . |
| 5,185,286 * | 2/1993 | Eguchi ................................... 437/84 |
| 5,321,298 * | 6/1994 | Moslehi ............................... 257/506 |
| 5,443,661 | 8/1995 | Oguro, et al. . |
| 5,629,534 | 5/1997 | Inuzuka et al. . |
| 5,663,588 | 9/1997 | Suzuki et al. . |
| 5,691,230 | 11/1997 | Forbes . |
| 5,736,435 | 4/1998 | Venkatesan et al. ................. 438/151 |
| 5,956,597 * | 9/1999 | Furukawa et al. .................... 438/405 |
| 6,022,781 * | 2/2000 | Noble, Jr. et al. ................... 438/296 |
| 6,043,135 * | 3/2000 | Noda .................................... 438/404 |

* cited by examiner

*Primary Examiner*—David Nelms
*Assistant Examiner*—David Nhu
(74) *Attorney, Agent, or Firm*—William D. Sabo (57) ABSTRACT

A method for forming a silicon on insulator region on a single crystal silicon substrate, comprising the steps of: forming a first dielectric region in a silicon substrate by etching, deposition, and chemical-mechanical polishing; forming a single crystal layer on the substrate by polysilicon deposition and re-growth or epitaxial grownth; removing portions of the single crystal layer to produce silicon islands that are fully on the first dielectric region; and filling in the spaces between the silicon islands with a second dielectric, by deposition and chemical-mechanical-polish, that overlaps peripheral portions of the first dielectric. Additional steps sub-divide the fully isolated silicon on insulator regions by etching trenches in the islands and backfilling with a third dielectric, by deposition and chemical-mechanical-polish.

16 Claims, 7 Drawing Sheets

METHOD FOR FABRICATION OF SILICON ON INSULATOR SUBSTRATES

FIELD OF THE INVENTION

The present invenition relates to the field of silicon on insulator technology;, and, more particularly it relates to a method for fabricating silicon oil insulator regions on a silicon wafer.

BACKGROUND OF THE INVENTION

Silicon on insulator (SOI) technology oilers many advantages over conventional bulk silicon technology. Among these is the ability to build high performance, high speed. low power complementary-metal-oxide-semiconductor (CMOS) devices.

Turning to the prior art, one well known method to produce a silicon on insulator substrate is by bonding together two silicon wafers, each having an oxide layer, in a high temperature furnace step. Usually one side of the fused wafer needs to be thinned by chemical-mechanical-polishing. Another well known method is SIMOX (Separation by Implanted Oxygen) technology. In this technique a high dose oxygen ion implantation step is performed to place oxygen atoms in the silicon wafer at a fixed distance from the surface. This is followed by an anneal step, which then forms the buried oxide layer. Both these processes produce whole wafer silicon on insulator wafers.

Other techniques for fabricating silicon on insulator substrates use etch and oxidation steps to produce isolated silicon islands in a silicon substrate. For example. U.S. Pat. No. 5,185,286 to Eguchi, describes a process for producing a laminated semiconductor comprising the steps of forming openings in an oxide film on a silicon wafer. Forming, a silicon nitride island midway between the openings, growing epitaxial silicon. polishing to produce a flat surface, and selectively oxidizing the epitaxial silicon over the original openings in the oxide layer. One concern with this method is that the silicon island which is produced is located between a block of silicon nitride and an area of thermally oxidized silicon, subjecting the island to stresses.

U.S. Pat. No. 5,321,298 to Moslehi, describes a method for forming a semiconductor on insulator wafer with a single crystal semiconductor substrate comprising the steps of etching trenches in the substrate, forming oxide on the bottom of the trenches, growing epitaxial silicon to partially fill the trenches, forming a nitride spacer on top of the trenches, growing a second epitaxial silicon to fill the trenches, removing the nitride spacer, etching the epitaxial silicon down to the oxide originally formed at the bottom of the trenches and then filling the new trenches with oxide. Drawbacks with this method are its complexity and the integrity of the silicon crystal structure grown on many epitaxial fronts.

U.S. Pat. No. 5,691,230 describes a method of forming silicon on insulator rows and islands in a silicon substrate. Trenches are directionally etched in the silicon substrate. The tops of the rows and bottoms of the trenches are coated with silicon nitride. An isotropic etch is used to partially undercut the silicon rows. A subsequent oxidation step fully undercuts the rows of silicon, isolating the silicon roses from adjacent active areas. This method leaves a topology that may be disadvantageous to fabrication of high,h density circuits.

The present invention is directed toward a method of fabricating silicon on insulator regions on a substrate that produces silicon islands that are of good crystal integrity, low stress and coplanar with the rest of the wafer surface, while easily fabricated.

SUMMARY OF THE INVENTION

The invention provides a method for forming regions of silicon on insulator in bulk silicon wafers. A trench or recess is first formed in the bulk silicon wafer by a first etch process, and it is then filled in with a first dielectric. After a chemical-mechanical-polish step to planarize the surface, dielectric filled trenches or islands are left surrounded by bulk silicon. At this point either polysilicon is deposited and a re-crystallization step performed or epitaxial silicon is grown directly using the exposed bulk silicon as a seed layer. This produces a single crystal silicon layer extending over the dielectric filled trenches or islands. A second silicon etch process is performed to remove all the single crystal silicon except in regions directly over the now buried first dielectric. Care is taken to ensure a lip or peripheral region of first dielectric is left exposed all around the remaining single crystal silicon. The trenches formed by this second etch are then filled with a second dielectric. Lathe second dielectric contacts the lip left exposed on the first dielectric. Therefore, after a chemical-mechanical-polish step, islands of single crystal silicon have been formed which are isolated from each other and the bulk silicon wafer.

A particular advantage of the invention is that it is suitable as a pre-fabrication process on dies where both bulk and silicon on insulator devices are to be fabricated, especially if identical CMOS devices are fabricated simultaneously in both the bulk and the silicon on insulator portions of the die. Therefore, it is an object of the present invention to provide a method suitable for both fabricating silicon on insulator wafers and bulk silicon wafers having silicon on insulator regions.

The method of forming the single crystal silicon layer described above can leave a seam of mismatched crystal planes and non-perfect crystal structure where the growth edges meet. When the size of the single crystal islands are large enough for many devices to be fabricated the scam region in the single crystal silicon in each island can be avoided. For example, gates would not be placed in these regions. However, if it is desirable to isolate individual devices in very small silicon islands. the silicon islands should be fabricated larger than required initially, and then sub-divided along the seam boundaries. This may be accomplished by etching a trench in each of the silicon islands along the seam boundary and backfilling with a third dielectric till. Therefore, it is a further object of the present invention to provide a method suitable for silicon on insulator regions having high quality crystal structure.

BRIEF DESCRIPTION OF THE DRAWINGS

The novel features believed characteristic of the invention are set forth in the appended claims. The invention itself however, as well as preferred modes of use, further objects and advantages thereof, will best be understood by reference to the following detailed description of illustrative embodiments when read in conjunction with the accompanying drawings, wherein:

DETAILED DESCRIPTION OF THE INVENTION

Figure 1:
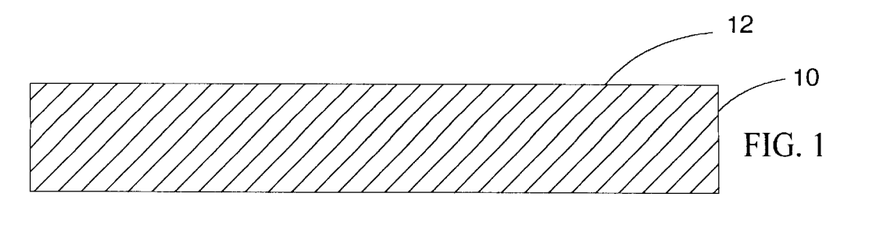
FIGS. 1 to 12 are partial cross-sectional views illustrating the steps of an embodiment of a method for forming an SOI structure according to the present invention.
Figure 2:
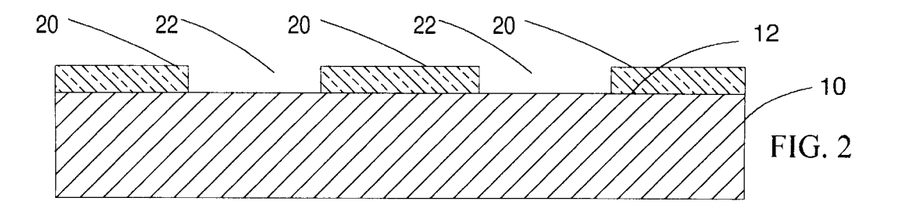
Figure 3:
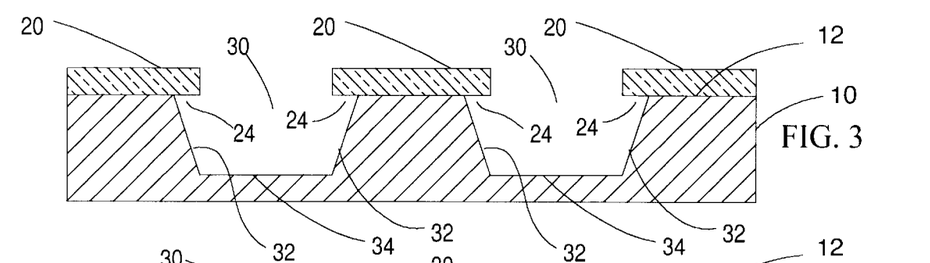
Figure 4:
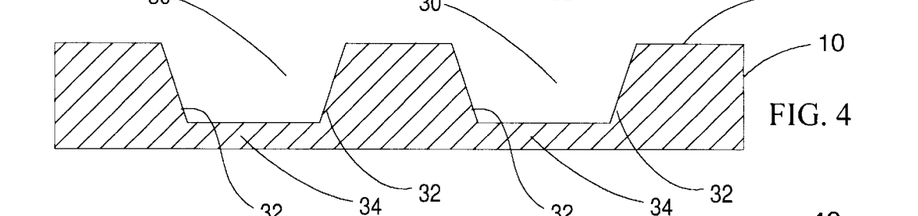

FIG. 1 shows single crystal <100> silicon substrate 10 having all upper surface 12. Silicon substrate 10 is single crystalline as upper surface 12 will-later. act as a seed layer for epitaxial growth and to control etch characteristics during subsequent processing. In FIG. 2, first masking layer 20 has been formed on top of silicon substrate 10 and trenches 22 etched into layer 20 exposing upper surface 12 of silicon substrate 10. First masking layer 20 may be formed, for example, by deposition of silicon oxide or silicon nitride. As shown in FIG. 3 trenches 30 have been etched in silicon substrate 10. Silicon trenches 30 include sidewalls 32 and bottom 34. Trenches 30 were formed by etching the silicon substrate with an anisotropic basic etch. When etched in strong bases, silicon in the <111> plane is not etched as readily as in the other planes, and sidewalls having an approximate slope of 35° normal to the <100> plane will be formed. One suitable etchant is an aqueous solution of tetramethylammonium hydroxide. A solution of 450 grams of the pentahydrate salt dissolved per liter of water will have a lateral etch rate of 0.4 microns/minute at 65° C. If trench 22 in first masking (layer 20 is 4000 angstroms wide and trench 30 etched 4000 angstroms deep, overhang 24 will be 650 angstroms. This overhang 24 allows the same photomask to be used at the next masking step. Other etchants that will produce similar preferential etching include 20% aqueous potassium hydroxide saturated with isopropanol at 80° C. and ethylenediamine/pyrocatechol/water mixtures, both of which are well known to the industry. In FIG. 4, masking layer 20 has been removed, leaving silicon trenches 30 in silicon substrate 10.

Figure 5:
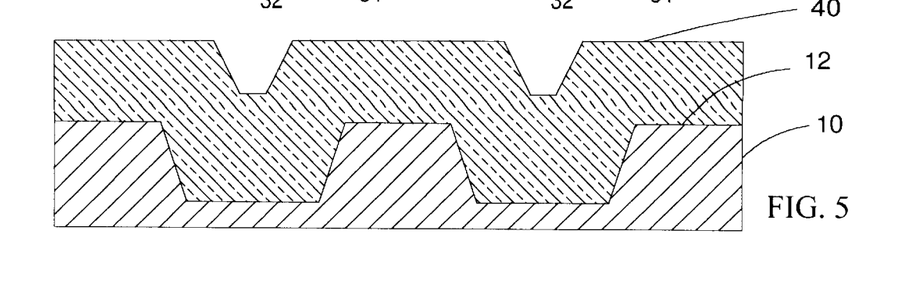
Figure 6:
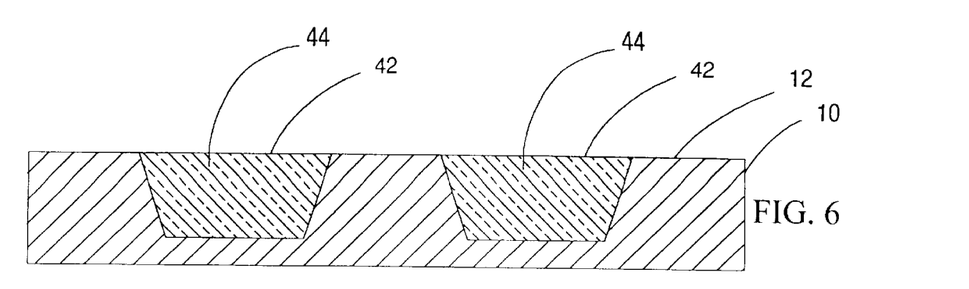

In FIG. 5, first dielectric layer 40 has been formed on silicon substrate 10, filling trenches 30. First dielectric layer 40 may be comprised, for example, of silicon oxide and if formed by chemical vapor deposition or low pressure chemical vapor deposition or other similar processes, will introduce relatively little stress into the silicon. As shown in FIG. 6, using a chemical-mechanical-polish process, first dielectric layer 40 has been polished so as to be coplanar with upper surface 12 of silicon substrate 10 forming dielectric regions 44 having upper surfaces 42. in silicon substrate 10.

Figure 7:
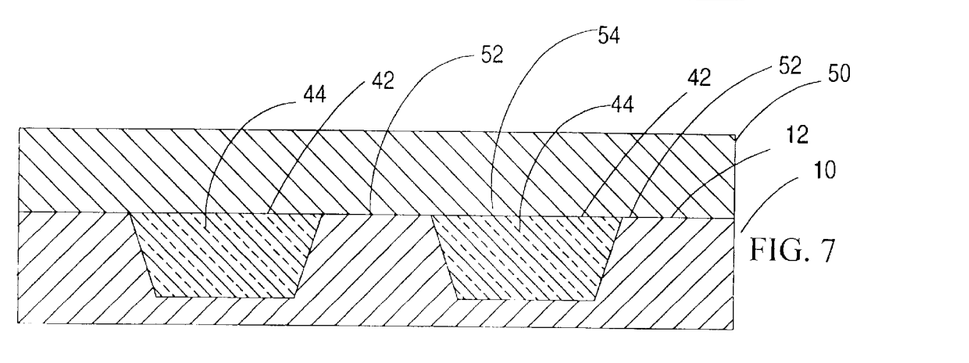
Figure 8:
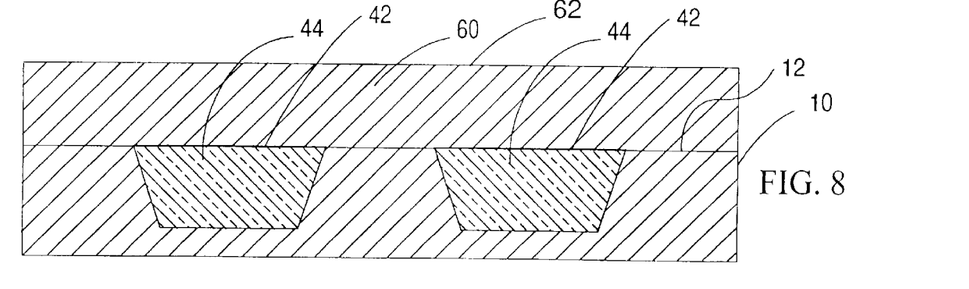

Referring to FIG. 7, polysilicon layer 50 has been deposited on silicon substrate 10). This layer will become the silicon in which active devices may be fabricated. In this example, the thickness of polysilicon layer 50 is approximately 2000 angstroms, although the thickness may vary. An annealing step of at least 400° C. is next performed to convert polysilicon layer 50 to a mono-crystalline layer. Conversion starts where regions 52 of polysilicon layer 50 contact upper surface 12 of silicon substrate 10 and progresses to central regions 54 of the polysilicon layer 50. FIG. 8 shows completed mono-crystalline layer 60 having the same crystal orientation as silicon substrate 10. An alternative method of creating silicon layer 60. as shown in FIG. 8, is direct epitaxial growth starting with the structure shown in FIG. 6. Epitaxial growth will occur starting from exposed upper surface 12 of silicon substrate 10. A chemical-mechanical-polish may be performed to flatten upper surface 62 of silicon layer 60.

Figure 9:
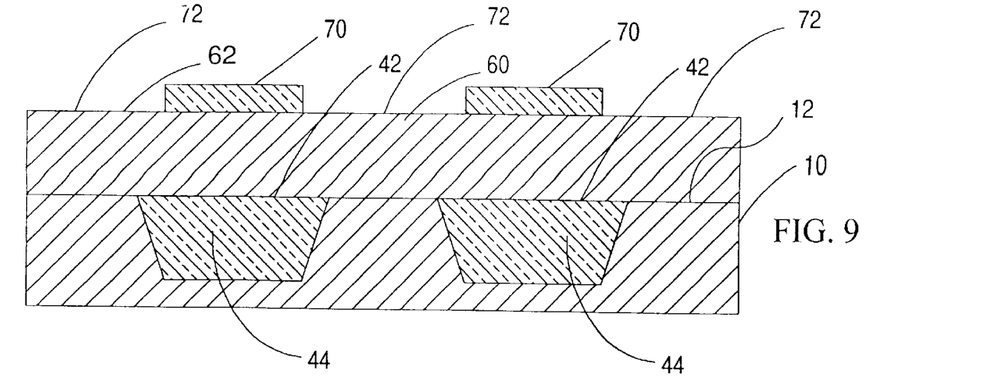
Figure 10:
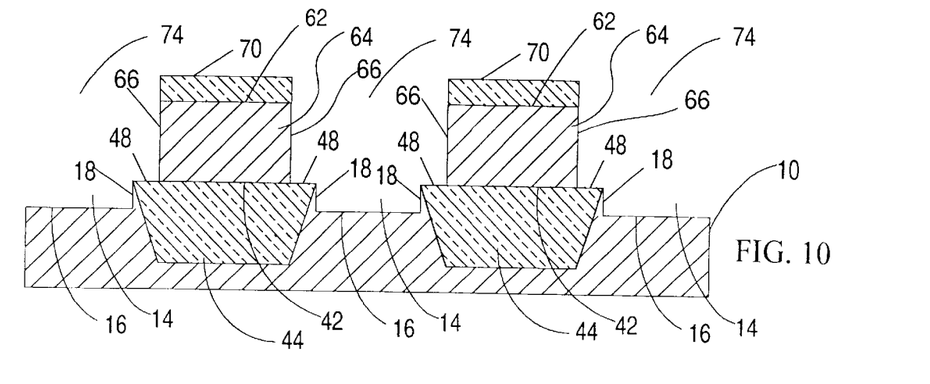

In FIG. 9, second masking layer 70 has been formed on top of silicon layer 60, and intersection trenches 72 etched into layer 70 exposing upper surface 62 of silicon layer 60. Second masking layer 70 may be formed, for example, by deposition of silicon oxide or silicon nitride. In FIG. 10 intersecting trenches 74 have been etched silicon layer 60 forming silicon region 64 having upper surfaces 62 and sidewalls 66. Trenches 74 may be etched using a reactive ion etch or other suitable process. A plurality of trenches 74 are etched perpendicular to each other in a grid pattern, although only one trench is shown in the sectional view of FIG. 10, leaving silicon regions 64 of silicon layer 60 exposed as mesas. Silicon regions 64 are fully landed on upper surface 42 of dielectric region 44, so that outer portion 48 of upper surface 42 of first dielectric region 44 is exposed. It is an important feature of the invention that outer portion 48 of upper surface 42 is exposed all around silicon regions 64 in order that each silicon region 64 be isolated from the others and from silicon substrate 10. Etching has also proceeded into silicon substrate 10 forming inner trenches 14, in the same grid pattern as trenches 74. In silicon substrate 10, the inner trenches 14 have bottom surfaces 16 and sidewalls 18. Formation of such inner trenches 14 is desirable but not essential.

Figure 11:
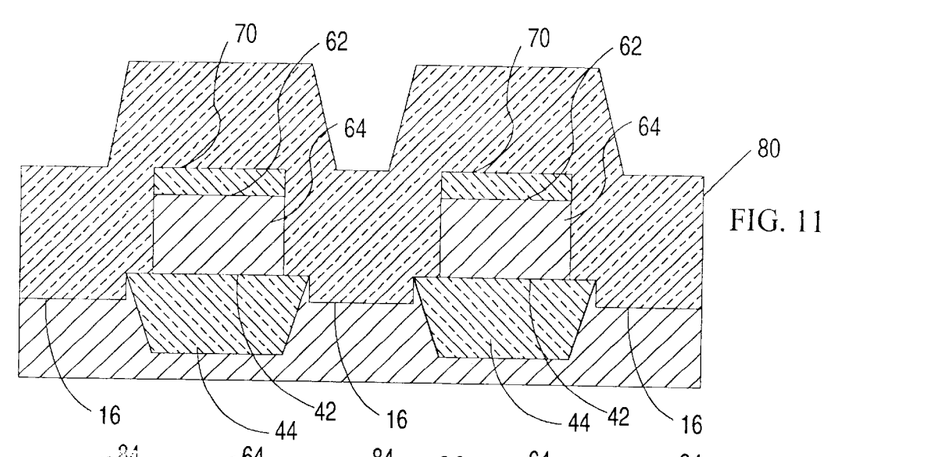
Figure 12:
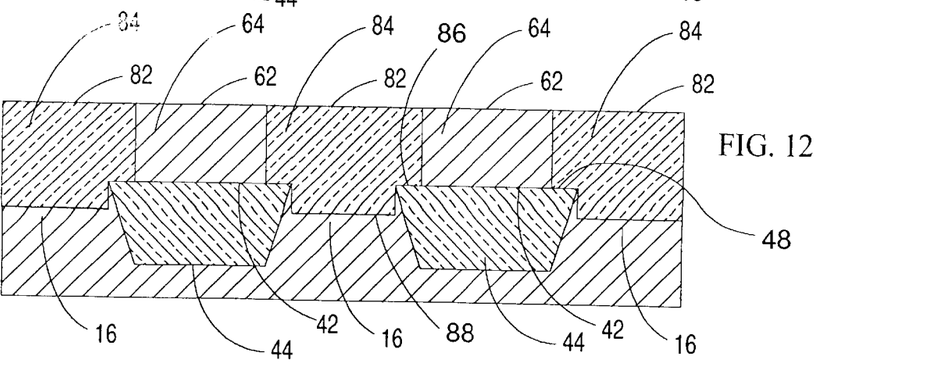

Referring to FIG. 11, second dielectric layer 80 has been deposited on silicon substrate 10. Second dielectric layer 80 may be comprised, for example, of silicon oxide and if formed by chemical vapor deposition or low pressure chemical vapor deposition or other similar processes, will introduce relatively little stress into the silicon. In FIG. 12, after a chemical-mechanical-polish process, second dielectric 80 has been polished so as to be coplanar with the upper surfaces 62 of silicon regions 64 forming intersecting dielectric trenches 84. These dielectric trenches 84 have upper surfaces 82 coplanar with upper surfaces 62 of silicon regions 64, lower peripheral surfaces 86 which are coextensive with outer portions 48 of upper surfaces 42 of dielectric regions 44, and bottom surfaces 88. Thus, silicon regions 64 are isolated from silicon substrate 10 by dielectric regions 44 and from each other by first intersection, dielectric trenches 84.

Figure 13:
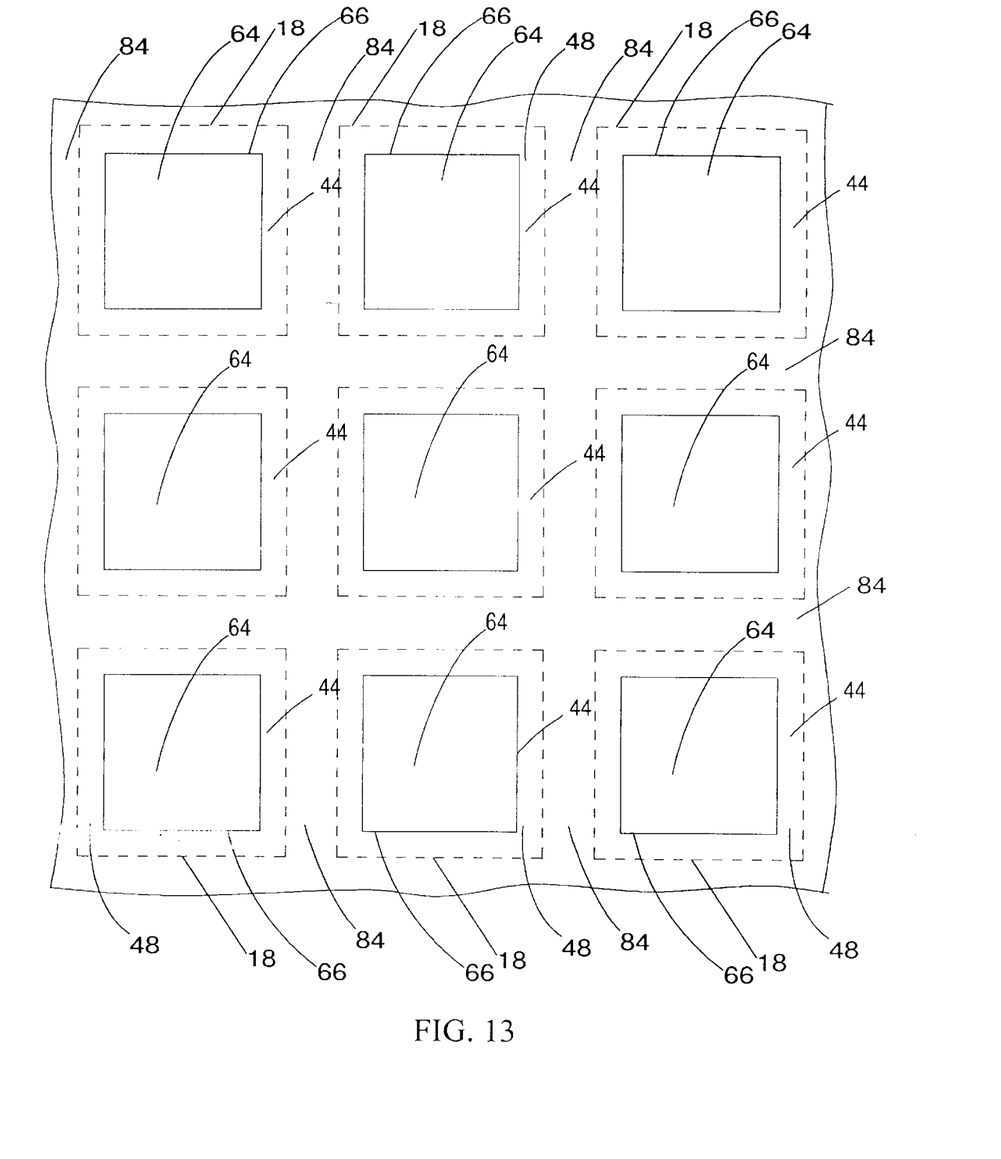
FIG. 13 is a plan view of the SOI structure formed by the method shown in FIGS. 1 to 12.

FIG. 13 is a plan view of a section of substrate 10. As shown, silicon regions 64 having sidewalls 66 are located on dielectric regions 44. as discussed above in connection with FIG. 10. As also shown, the sidewalls 18 of silicon substrate 10 define outer portions 48 of upper surfaces 42 of silicon regions 44. Silicon regions 64 are surrounded by intersecting dielectric trenches 84.

Figure 14:
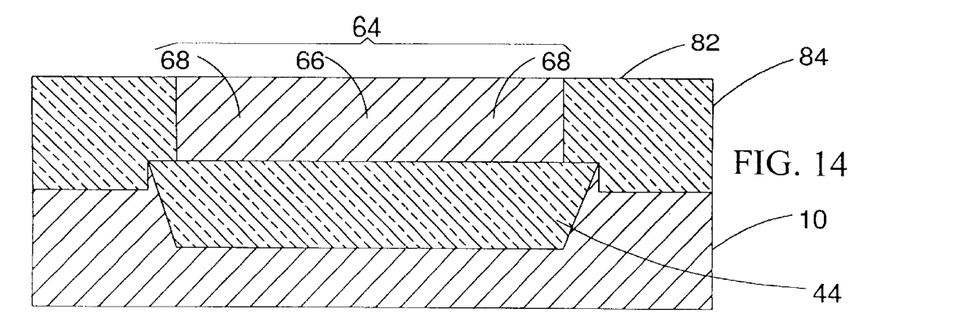
FIGS. 14 to 17 are partial, cross-sectional views illustrating additional steps of an embodiment of the method for forming an SOI structure according to the present invention.

At this point conventional device formation may proceed by building-devices in silicon regions 64. Alternatively, additional steps may be performed as illustrated in FIGS. 14–17. Since silicon regions 64 were formed either by crystallization or epitaxial growth which started from the outside edges in, the quality of the crystal structure is likely to be poorer in the central portions of the silicon regions where the crystallization fonts or growth fronts meet, forming a plane of poorer crystal Structure or mismatched crystal planes. This is illustrated in FIG. 14, which shows a silicon region 64 having edge portions 68 and central portion 66.

Figure 15:
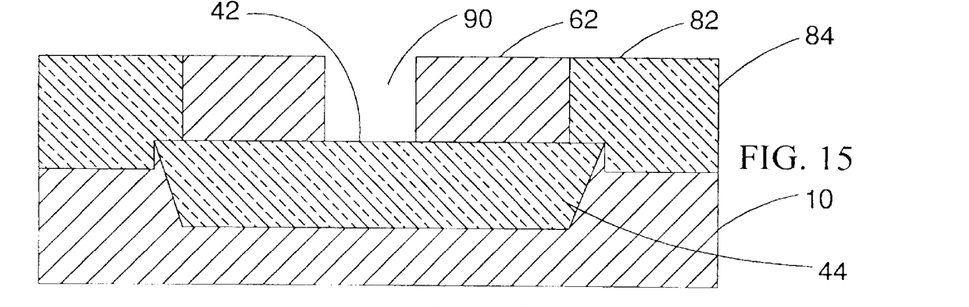
Figure 16:
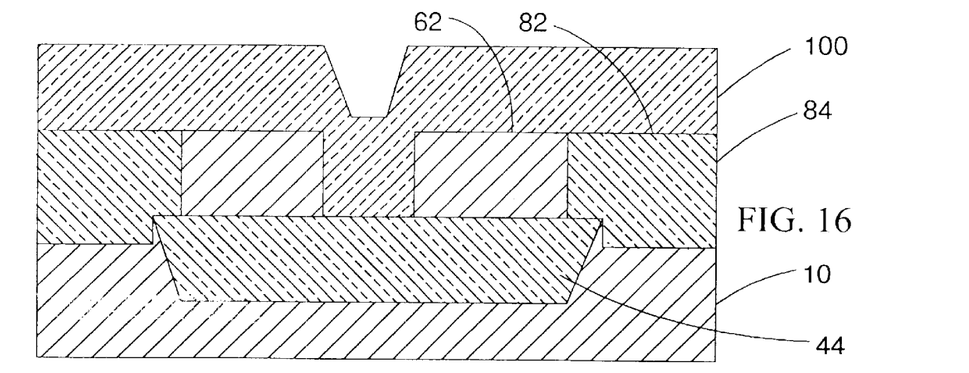
Figure 17:
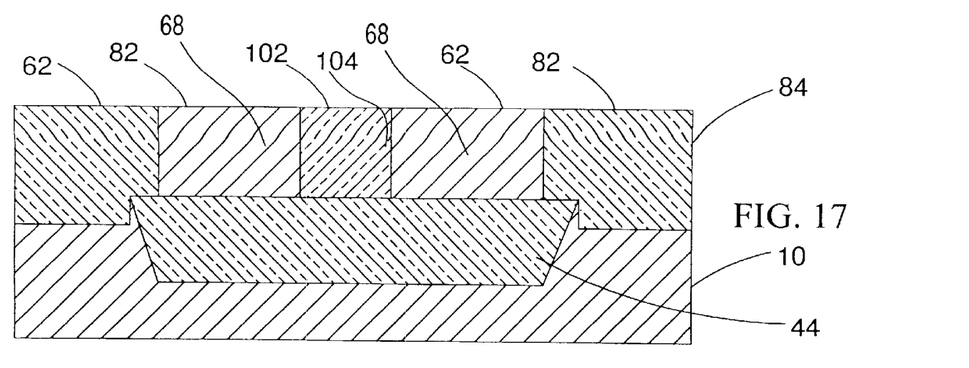

As shown in FIG. 15, intersecting pairs of trenches 90 have been etched in central portion 66 of silicon region 64. Trenches 90 are etched perpendicularly to one another in each silicon region 64 in order to divide the region 64, in this case, into four sections, although only one is shown in the sectional view of FIG. 15. Trenches 90 may be etched using a reactive ion etch or other suitable process. Trenches 90 are aligned to the central axes of silicon regions 64. In FIG. 16, third dielectric layer 100 has been deposited. Third dielectric layer 100 may be comprised, for example, of silicon oxide. and if formed by chemical vapor deposition or low pressure chemical vapor deposition or other similar processes, will introduce relatively little stress into the silicon. In FIG. 17, after a chemical-mechanical-polish process, third dielectric layer 100 has been polished so as to be coplanar with upper surfaces 62 of silicon regions 64 and upper surfaces 82 of silicon regions 84, forming intersecting dielectric regions 104 having upper surfaces 102 coplanar with top surfaces 62 and 84.

Figure 18:
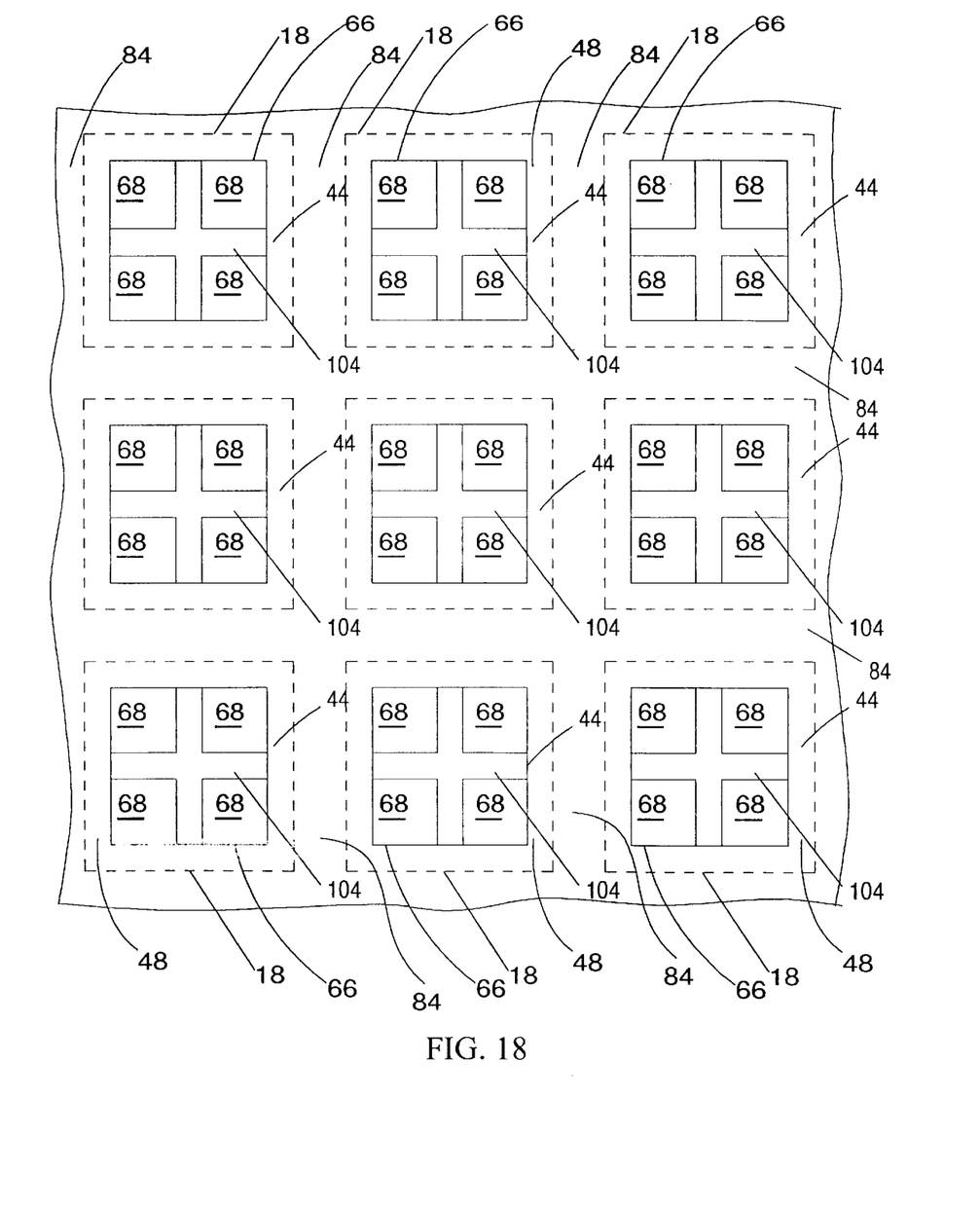
FIG. 18 is a plan view of the SOI structure formed by the method shown in FIGS. 1 to 12 after the additional steps shown in FIGS. 14 through 17 have been performed.

FIG. 18 is a plan view of a section of substrate 10. As shown, silicon regions 64 having sidewalls 66 are located on dielectric regions 44. As also shown, the sidewalls 18 of silicon substrate 10 define outer portions 48 of upper surfaces 42 of silicon regions 44. Intersecting dielectric regions 104 divide silicon region 64 into four smaller silicon sections 68.

At this point conventional device formation may proceed. The processes described above may be performed over an entire semiconductor die or just a portion of the die, allowing mixed conventional and silicon on insulator devices.

Figure 19:
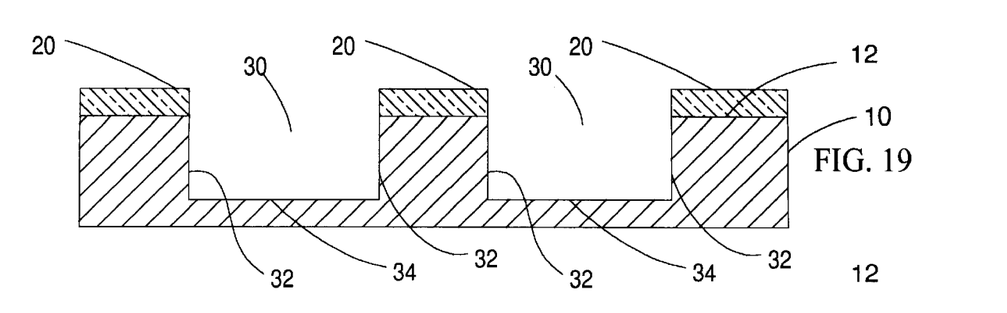
FIG. 19 is a partial, cross-sectional view of an alternative embodiment of the present invention.
Figure 20:
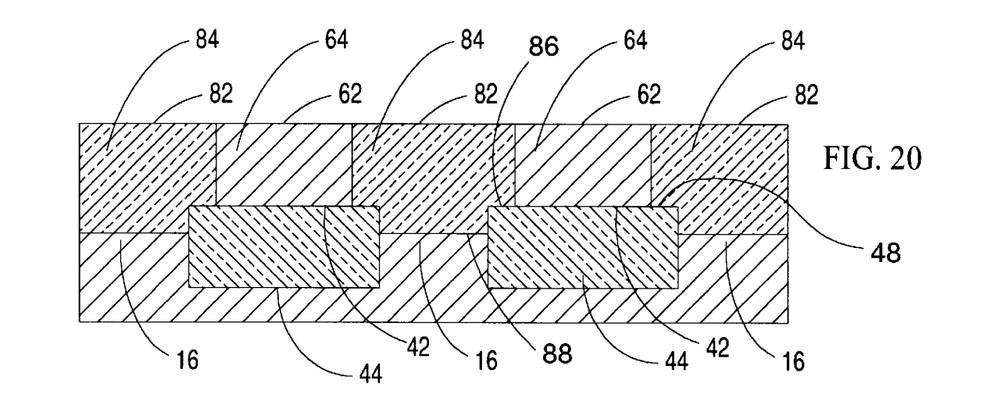
FIGS. 20 and 21 are partial cross-sectional views of an alternative embodiment of the present invention fabricated with additional steps.
Figure 21:
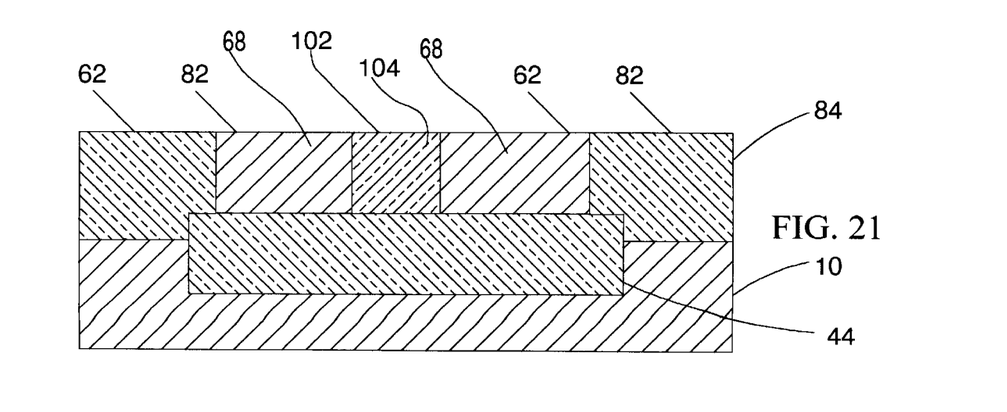

In a second embodiment trenches 30 shown in FIG. 3 have been etched using a directional reactive ion etch or other suitable process, producing trench sidewalls 32 having substanlially vertical sides as shown in FIG. 19. The silicon substrate need not have a <100> crystal orientation. Otherwise, the processes are substantially the same as those previously described. The resultant structures are shown in FIG. 20 when the processes shown in FIGS. 1, 2, 19, and 4 through 12 have been performed and in FIG. 21 when the additional process steps shown in FIGS. 14 through 17 have been performed. Two differently sized masks are required in order to ensure silicon regions 64 are fully landed on dielectric regions 44.

The description of the embodiments of the present invention is provided above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of fabricating a silicon on insulator region on a silicon substrate having an upper surface, comprising the steps of:
   forming a first dielectric region from a first dielectric material in said silicon substrate, said first dielectric region having an upper surface coplanar with the upper surface of said silicon substrate;
   forming a silicon region having an upper surface on said first dielectric region wherein said silicon region fully landed on the upper surface of said first dielectric region is; and
   forming a second dielectric region from a second dielectric material, wherein said second dielectric region is formed around said silicon region and has an upper surface coplanar with the upper surface of said silicon region and a lower peripheral surface coextensive with a periphery region of the upper surface of said first dielectric region.

2. The method according to claim 1, further comprising the steps of: forming a third dielectric region from a third dielectric material in said silicon region, said third dielectric region having a bottom surface contacting the upper surface of said first dielectric region, an upper Surface coplanar with the upper surface of said silicon region and ends overlapping the periphery region of said second dielectric region, in a middle axial region of said silicon region to divide said silicon region into at least two electrically isolated portions.

3. The method according to claim 2, wherein each of said first dielectric material, said second dielectric material and said third dielectric material is formed by deposition.

4. The method according to claim 3, wherein each of said first dielectric material, said second dielectric material and said third dielectric material comprises silicon oxide.

5. The method according to claim 3, wherein the step of forming said silicon region includes the step of epitaxial growth.

6. The method according to claim 3, wherein the step of forming said silicon region includes the steps of deposition of a polysilicon layer and re-crystallization of said polysilicon layer.

7. A method of fabricating a silicon on insulator region on a silicon substrate having an upper surface, comprising the steps of:
   forming a first masking layer on the upper surface of said silicon substrate, said first masking layer having an opening therein exposing a first portion of the upper surface of said silicon substrate;
   forming, a first trench through said first portion and into said silicon substrate;
   depositing a first dielectric layer to fill the trench in said silicon substrate;
   planarizing said first dielectric layer with respect to said silicon substrate to form a first dielectric region in a first planar surface;
   forming a silicon layer having an upper surface on said first planar surface;
   forming a second masking layer on said silicon layer, said second masking layer having an opening therein exposing a part of the upper surface of said silicon layer;
   forming a second trench through said part and into said silicon layer, the second trench exposing a second portion of said silicon substrate and a periphery of the upper surface of said first dielectric in said first planar surface;
   depositing a second dielectric layer to fill the second trench in said silicon layer; and
   planarizing said second dielectric layer with respect to said silicon layer to form a second dielectric region and a single crystal silicon region in a second planar surface.

8. The method according to claim 7, further comprising the steps of:
   forming a third masking layer on said second planar surface, said third masking layer having an opening therein exposing a portion of the upper surface of said single crystal silicon region;
   forming at least one trench in said silicon region, the trench having a lower surface contacting the upper surface of said first dielectric region and ends coextensive with the periphery region of the top surface of said first dielectric region, in a middle axial region of said silicon region;

depositing a third dielectric layer to fill the trench in said silicon region; and planarizing said third dielectric layer with respect to said silicon layer to form a third dielectric region in said second planar surface dividing said silicon region into at least two electrically isolated portions.

9. The method according to claim 8, wherein each of said first dielectric material, said second dielectric material and said third dielectric material are formed by deposition.

10. The method according to claim 9, wherein each of said first dielectric material, said second dielectric material and said third dielectric material comprises silicon oxide.

11. The method according to claim 9, wherein the step of forming said silicon layer includes the step of epitaxial growth.

12. The method accordinig to claim 9, wherein the step of forming said silicon region includes the steps of deposition of a polysilicon layer and re-crystallization of said polysilicon layer.

13. The method according to claim 8, wherein the first trench is formed by etching said silicon substrate with an isotropic etchant; and further comprising the step of removing said first masking layer.

14. The method according to claim 8, wherein the first trench is formed by etching said silicon substrate with a directional etch process.

15. The method according to claim 13, wherein said etchant is an aqueous solution of tetramethylammonium hydroxide, alcoholic potassium hydroxide, or aqueous ethylenediamine/pyrocatechol.

16. The method according to claim 14, wherein said directional etch process comprises a reactive ion etch process.

* * * * *